(12) United States Patent
Chen

(10) Patent No.: US 8,159,026 B2
(45) Date of Patent: Apr. 17, 2012

(54) LATERAL HIGH-VOLTAGE SEMICONDUCTOR DEVICES WITH MAJORITIES OF BOTH TYPES FOR CONDUCTION

(75) Inventor: Xingbi Chen, Chengdu (CN)

(73) Assignee: University of Electronics Science and Technology, Sichuan (CN)

( * ) Notice: Subject to any disclaimer, the term of this patent is extended or adjusted under 35 U.S.C. 154(b) by 230 days.

(21) Appl. No.: 12/753,554

(22) Filed: Apr. 2, 2010

(65) Prior Publication Data

US 2010/0252883 A1 Oct. 7, 2010

(30) Foreign Application Priority Data

Apr. 7, 2009 (CN) .......................... 2009 1 0131196

(51) Int. Cl.
*H01L 21/02* (2006.01)
(52) U.S. Cl. ........ 257/335; 257/328; 257/342; 257/367; 257/E21.358; 257/E21.417; 257/E27.015; 257/E29.012; 257/E29.181; 257/E29.211; 257/E29.256
(58) Field of Classification Search .......... 257/141–147, 257/328–367, E21.358, E21.417, E27.015, 257/E29.012, E29.181, E29.211, E29.256
See application file for complete search history.

(56) References Cited

U.S. PATENT DOCUMENTS

| | | | |
|---|---|---|---|
| 5,726,469 A | 3/1998 | Chen | |
| 6,310,365 B1 | 10/2001 | Chen | |
| 6,998,681 B2 | 2/2006 | Chen | |
| 7,683,426 B2 * | 3/2010 | Williams et al. | 257/335 |
| 7,968,936 B2 * | 6/2011 | Denison et al. | 257/328 |
| 2006/0186477 A1 * | 8/2006 | Kanda et al. | 257/367 |
| 2007/0063274 A1 * | 3/2007 | Kanda et al. | 257/335 |
| 2007/0166896 A1 * | 7/2007 | You et al. | 438/153 |
| 2009/0309132 A1 * | 12/2009 | Cai | 257/147 |
| 2010/0032758 A1 * | 2/2010 | Wang et al. | 257/343 |
| 2010/0148255 A1 * | 6/2010 | Fuernhammer et al. | 257/342 |
| 2010/0301388 A1 * | 12/2010 | Lin et al. | 257/141 |
| 2011/0260246 A1 * | 10/2011 | Disney et al. | 257/337 |

OTHER PUBLICATIONS

Chen, X.B. et al., "Theory of Optimum Design of Reversed-Biased p-n Junctions Using Resistive Field Plates and Variation Lateral Doping"; Research Institute of Microelectronics, University of Electronic Science and Technology of China; Solid-State Electronics, 1992, vol. 35, No. 9, pp. 1365-1370.

Chen, X.B. et al., "Lateral high-voltage devices using an optimized variational laternal doping"; Int. J. Electronics, 1996, vol. 80, No. 3, pp. 449-459.

* cited by examiner

*Primary Examiner* — Michael Lebentritt
(74) *Attorney, Agent, or Firm* — Pillsbury Winthrop Shaw Pittman, LLP

(57) ABSTRACT

This invention provides a lateral high-voltage semiconductor device, which is a three-terminal one with two types of carriers for conduction and consists of a highest voltage region and a lowest voltage region referring to the substrate and a surface voltage-sustaining region between the highest voltage region and the lowest voltage region. The highest voltage region and the lowest region have an outer control terminal and an inner control terminal respectively, where one terminal is for controlling the flow of majorities of one conductivity type and another for controlling the flow of majorities of the other conductivity type. The potential of the inner control terminal is regulated by the voltage applied to the outer control terminal. The figure presented schematically shows a device by using an n-MOSFET to control the flow of electrons and a pnp bipolar transistor to control the flow of holes, and the potential of the base region of the pnp transistor is regulated by the voltage applied to the gate electrode of the n-MOSFET.

18 Claims, 11 Drawing Sheets

LATERAL HIGH-VOLTAGE SEMICONDUCTOR DEVICES WITH MAJORITIES OF BOTH TYPES FOR CONDUCTION

CROSS-REFERENCE TO RELATED APPLICATIONS

This application is based upon and claims the benefit of priority from Chinese Patent Application No. 200910131196.7, filed Apr. 7, 2009, the entire contents of which are incorporated herein by reference.

FIELD OF THE INVENTION

The present invention relates to a technique of semiconductor devices, and specifically to lateral high-voltage semiconductor devices.

BACKGROUND OF THE INVENTION

It is well-known that the breakdown voltage, the on-resistance and the reliability are the most important issues of power devices.

During turning-on and turning-off of lateral high-voltage power devices, there is a transient stage with high voltage and large current. When a unipolar lateral power device operating in this stage, the carriers introduced by the large-current density produce a significant deviation of distribution of electric flux density of the lateral device from that case of without carriers, making the electric field of a local place be enhanced and therefore the impact ionization coefficients increased, resulting a local avalanche breakdown. The SOA (Safe Operating Area) of the device is then reduced by such a local avalanche breakdown, and the reliability of the device is also decreased.

To diminish such an effect, a conventional measure is using a small current density in the turn-on stage. However, such a method is at an expense of the performance of the device. Also, a perfect elimination of the deviation of electric flux density distribution of surface is impossible.

REFERENCES

[1] X. B. Chen, et al., "Theory of optimum design of reverse-biased p-n junctions using resistive field plate and variation lateral doping", Solid-State Electronics, Vol. 35, No. 9, pp. 1365-1370 (1992).
[2] X. B. Chen, et al., "Lateral high-voltage devices using an optimized variation lateral doping", Int. J. Electronics, Vol. 80, No. 3, pp. 449-459 (1996).
[3] X. B. Chen, U.S. Pat. No. 6,998,681 B2, or Chinese patent ZL 200310101268.6.
[4] X. B. Chen, U.S. Pat. No. 6,310,365B1, or Chinese patent ZL 98116187.1.
[5] X. B. Chen, U.S. Pat. No. 5,726,469, or Chinese patent ZL 95108317.1.

DESCRIPTION OF THE PREFERRED EMBODIMENTS

The detail of the present invention and the examples of the application of the present invention will be demonstrated hereinafter. In all of the following figures, the same number means the same component or element.

Figure 1:
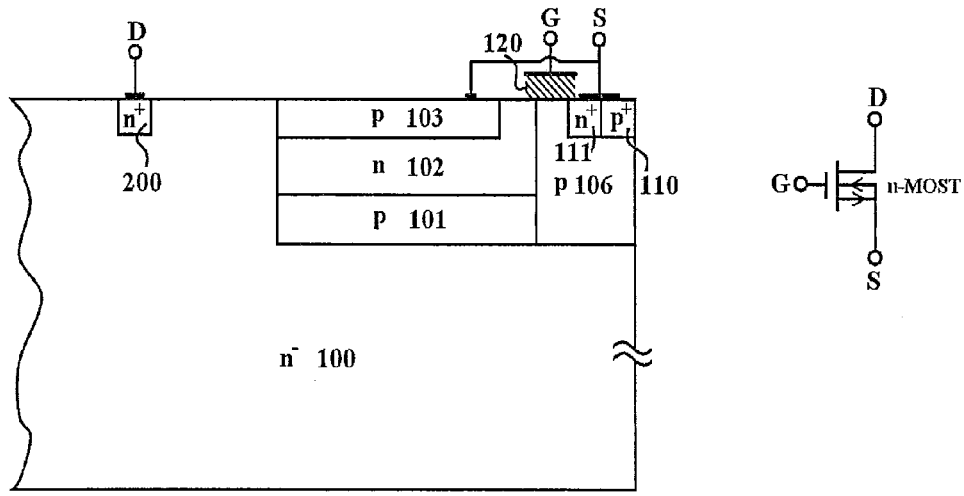
FIG. 1 is a schematic cross-sectional view of an n-LDMOS by using the basic voltage-sustaining structure of Ref. [3].

FIG. 1 is a schematic cross-sectional view of an n-LDMOS by using the basic voltage-sustaining structure of Ref. [3]. The n-LDMOS uses electrons as majority carriers for conduction. In this figure, D stands for the drain electrode, S stands for the source electrode and G stands for the gate electrode of the n-LDMOS. The shaded area 120 stands for the gate oxide or gate insulator. D is connected to n$^+$-drain region 200, and S is connected both to n$^+$-source region 111 and source-body p-region 106 through p$^+$-region 110. The surface voltage-sustaining region consists of p-region 101, n-region 102, p-region 103 and a part of p-region 106. Note that the connection between S and p-region 103 may not be an outer one. Instead of that, p-region 103 can be connected directly to p-region 106 at certain part of the interdigitated layout, e.g. at the finger edge(s) or finger end(s), or even no connection with the p-region 103 still being fully depleted under the condition of the device sustaining a high voltage. Thus, the meaning of the connection is only to present that the potential of the rightmost part of p-region 103 is nearly the same as the potential of p-region 106. Such connections in the following figures are considered as the same meaning stated above.

According to the Ref. [3], when the electric flux density of net ionized acceptor of the surface voltage-sustaining region decreases according to the increasing of the surface distance from the edge of source-body region to the drain region, the device can sustain the largest reverse-biased voltage within a shortest surface distance. Here, the value of the electric flux density of net ionized acceptor means a result of the number of the ionized acceptor of the p-regions minus the number of the ionized donor of the n-region within a not too large area in the surface divided by the area itself. Note that a not too large area means an area having a dimension much smaller than the depletion width, $W_{pp}$, of a one-sided abrupt parallel plane junction formed by the same substrate under the breakdown voltage. However, the dimension of the area can be larger than the thickness of the surface voltage-sustaining region.

Assume that $D_0$ is the density of net ionized acceptor of the depleted layer in a one-sided abrupt parallel plane junction formed by the same n-substrate 100 under its breakdown voltage. Then, in the case of the surface voltage-sustaining region is not a parallel plane one, e.g. is shown as in FIG. 1, in order to sustain the voltage close to the breakdown voltage of the parallel plane junction made by the same substrate in a small lateral dimension, one of the practical methods is that: the dose (the density of ionized impurities) of p-region 101 is $2D_0$ at the right end, and then gradually decreases according to the lateral distance, and eventually becomes a value of $D_0$ at the left end of the region; the doses of n-region 102 and p-region 103 are constant, and the values of them are $2D_0$ and $D_0$, respectively. Thereupon, the density of net ionized acceptor in the surface voltage-sustaining region in such an n-LDMOS meets the demand of sustaining a largest breakdown voltage. Besides, the dose in n-region 102 can be very large, making the on-resistance of the device being very small.

Figure 2:
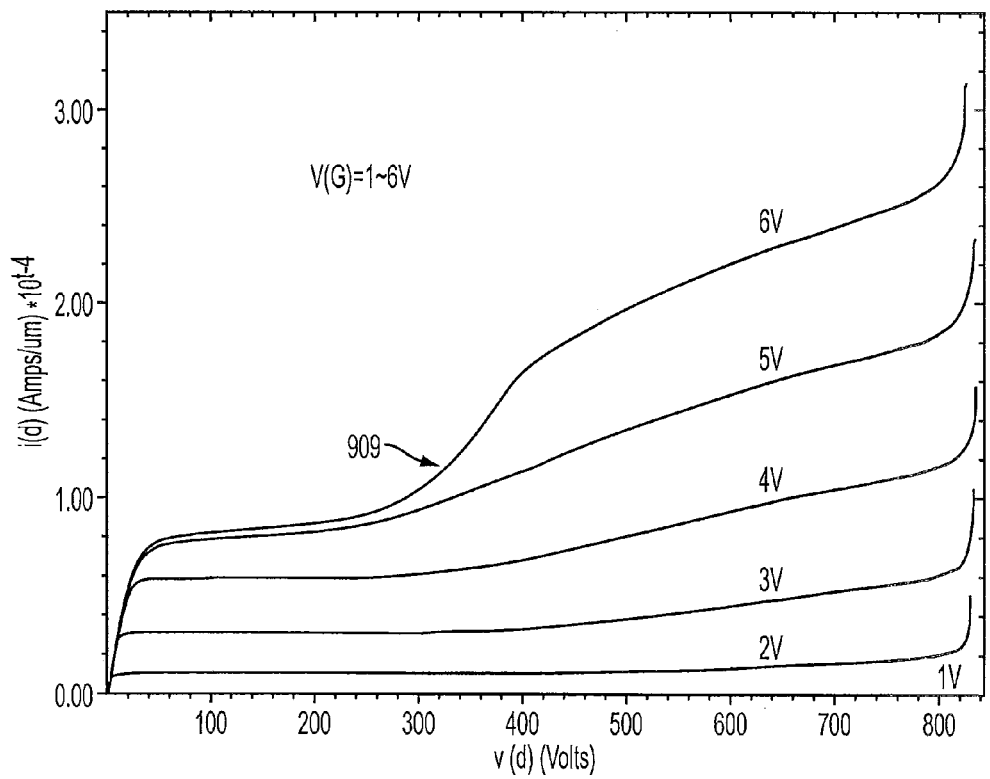
FIG. 2 shows the simulation result of $I_D$~$V_D$ characteristics of the n-LDMOS shown in FIG. 1.

FIG. 2 shows the simulation result of $I_D \sim V_D$ characteristics of the n-LDMOS designed by using the method mentioned above and done by using TMA-MEDICI. The breakdown voltage is 800V. Here, the voltage $V_{GS}$ varies from 1V to 6V and the voltage $V_{DS}$ varies from 0V to 800V. It can be seen from FIG. 2 that when the $V_{GS}$ is 6V and $V_{DS}$ is increased about to 300V, the order of magnitude of the current density achieves to about $1 \cdot 10^{-4}$ A/μm, there appears an "upward curling" of the curve shown as 909. Such phenomenon does not exist in a normal VDMOSFET in the saturation region. The deviation of the current versus voltage behaviour from a normal VDMOSFET is caused by impact ionization. Due to that when the density of current is large enough, the influence on the electric flux density of surface voltage-sustaining region caused by the electron charges introduced by the current can not be neglected. Thus, the negative flux density introduced by the large electron current counteracts part of the positive flux density in n-region 102, so the ideal electric field distribution is changed to be not an ideal one. Consequently, the electric field at some location becomes larger, which can lead to considerable impact ionization. Although such impact ionization does not caused avalanche breakdown, it produces the phenomenon of "upward curling". That is undesirable because it may influence the reliability of the device. Therefore, such phenomenon should be avoided as much as possible. Note that such phenomenon happens not only in the devices formed by using the technique of VLD as the surface voltage-sustaining region, but also in the devices using other techniques, e.g. using the technique of RESURF or JTE.

A method to remove such phenomenon is to limit the current density. Assume that when the net density of negative charges introduced by the electron current equals to tenth of $D_0$. If the length of the surface voltage-sustaining is 100 μm, and the value of $V_{DS}$ is 100V, the electric field is about $1 \cdot 10^4$ V/cm. Under such an electric field, the velocity of electron is saturated, having a value of $7 \cdot 10^6$ cm/s. If the value of $D_0$ is $2 \cdot 10^{12}$ cm$^{-2}$, then the corresponding allowable maximum current density, $j_{max}$, is $2 \cdot 10^{-5}$ A/μm.

Although a limiting of the maximum value of current density can be used to avoid the "upward curling" of $I_D \sim V_{DS}$ shown in FIG. 1, it is desired to have larger current density so that the area of chip can be saved for a large current capability. In order to get this purpose, the present invention proposes a method to implement a three-terminal lateral power device by simultaneously introducing equal amount of two types of carriers. Here, when the value of the density of electron current reaches a certain value, the electric flux of electron introduced by the electron current can be entirely offset by the electric flux of introduced holes, so the influence on the distribution of electric flux density of device caused by carriers can be eliminated. It then can not only avoid the phenomenon of "upward curling", but also have a larger maximum current density for the reason that another type of carriers for conduction reduces the on-state voltage drop of the device at the same current density.

Since the saturated velocity of hole is about half of that of electron, the introduced hole current density required is only half of the introduced electron current density.

Figure 3:
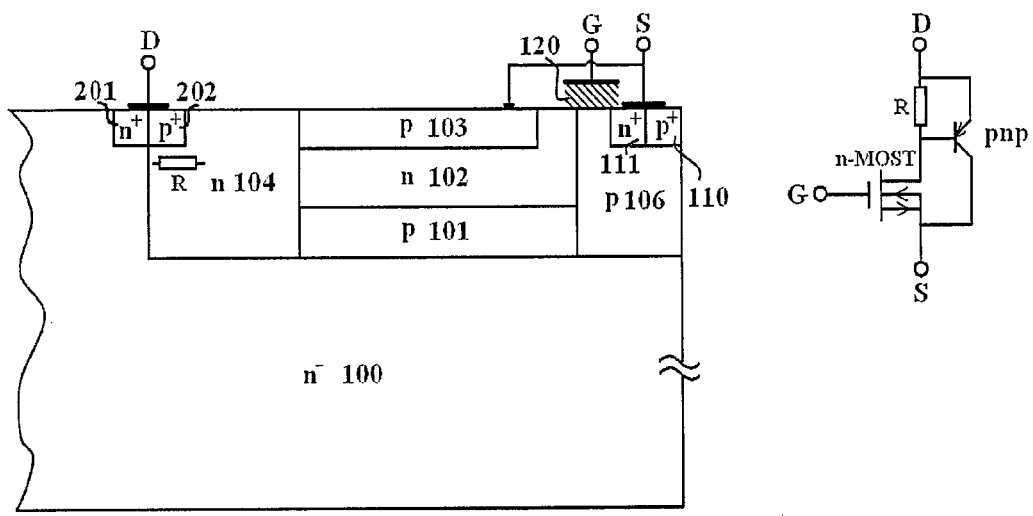
FIG. 3 shows schematically a three-terminal lateral power device of this invention by using two types of carriers for conduction (the figure shown on the right is its equivalent circuit).

FIG. 3 shows, a three-terminal lateral power device using two types of carriers for conduction. The figure shown on the right is its equivalent circuit. Here, the holes are introduced by a pnp bipolar transistor, and the electrons are introduced by the n-LDMOS. The electrode D is connected to both the n$^+$-drain region 201 of n-LDMOS and p$^+$-emitter region 202 of the pnp bipolar transistor. Electrode S is connected to both n$^+$-source region 111 of n-LDMOS and source-body p-region 106 of n-LDMOS through p$^+$-region 110. Control terminal G is the gate electrode of n-LDMOS. The shaded area 120 stands for the gate oxide or gate insulator. n-region 104 and p-region 103 are the base region and collector region respectively. The surface voltage-sustaining region of the device is constructed by p-region 101, n-region 102, p-region 103, a part of n-region 104 and a part of p-region 106. When a voltage applied across the control terminal G with respect to source-body region of n-LDMOS is larger than the threshold voltage of the n-LDMOS, an electron current flow from n$^+$-region 201 to source region of n-LDMOS through n-region 104. The portion of n-region 104 shown in this figure can be equivalent to a series resistor R for electron current. Thus, from the equivalent circuit of the right portion of this figure, there is a voltage drop across 104 when there is an electron current, which makes the emitter junction of pnp have a forward biased voltage. When the value of this voltage reaches above 0.6V (refer to the silicon transistor), holes is injected to n-region 104 from p$^+$-region 202, and then swept into p-region 103, a hole current is thus formed. It is obviously that such device is equivalent to a kind of anode-shorted IGBT.

It is worthy to note that when the device in FIG. 3 is implemented, all the holes coming from p$^+$-region 202 must be ensured to flow through p-region 103, but not through p-region 101. If the holes flow through p-region 101, the electric flux density of the surface voltage-sustaining region can be superficially still satisfied the demand of optimum distribution. However, not all of the electric flux density of the holes flowing through p-region 101 is offset by that of the electrons flowing through n-region 102, a portion of electric flux density of holes flowing through p-region 101 are neutralized by that of ionized acceptors in 101, which results a diminish of the dose of 101. Now, since the ionized acceptor in the depleted region in 101 acts to form a barrier of electrons to obstruct them flow from 102 into n$^-$-region 100, the barrier height would be reduced or even disappeared once there are a large number of holes in 101. Such a flow of electrons will cause a deviation of the electric flux density of surface voltage-sustaining region from the optimum distribution, and results the phenomenon of "upward curling" again.

Figure 4:
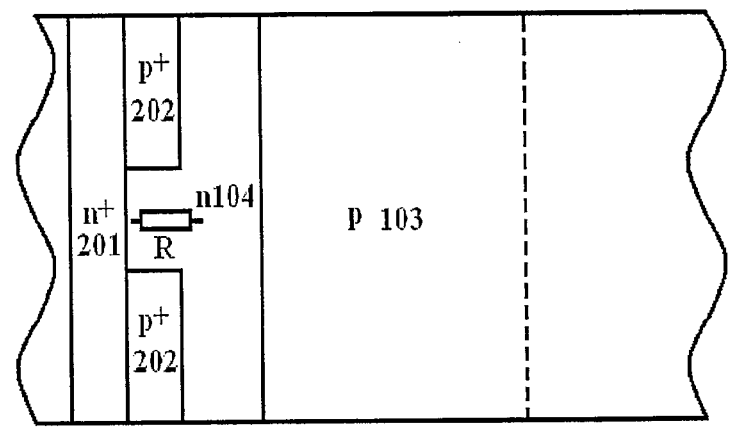
FIG. 4 shows a top view of an example for another form of the resistor in FIG. 3.

The resistor R in the circuit of the right portion of FIG. 3 can be realized in other way instead of that shown in the left portion of FIG. 3. The paths of electron current in 104 can have different structure. FIG. 4 is a top view of an example for another form of the resistor. It can be seen from this figure that when the electron current flows from 201 to the surface voltage-sustaining region through 104, a forward biased voltage drop across 202 and 104 would be generated, so the hole current can be introduced. Not to mention, the resistor can even be replaced by an active resistance formed by a device.

Figure 5:
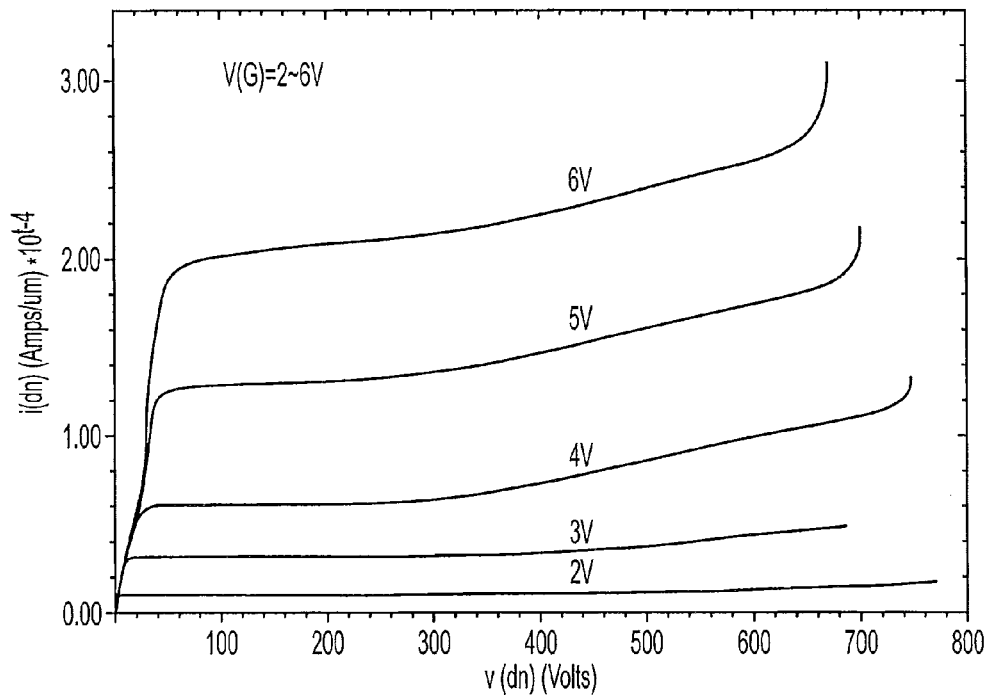
FIG. 5 shows the output characteristic curves of the device of FIG. 3.

FIG. 5 shows the output characteristic curves of the device of FIG. 3, simulated by using TMA-MEDICI package. It should be pointed out that although the parameters of the simulated device are not optimized, the phenomenon of "upward curling" is drastically be diminished in comparison with the curves in FIG. 2. Moreover, the current density in the linearity region has been increased significantly.

Figure 6:
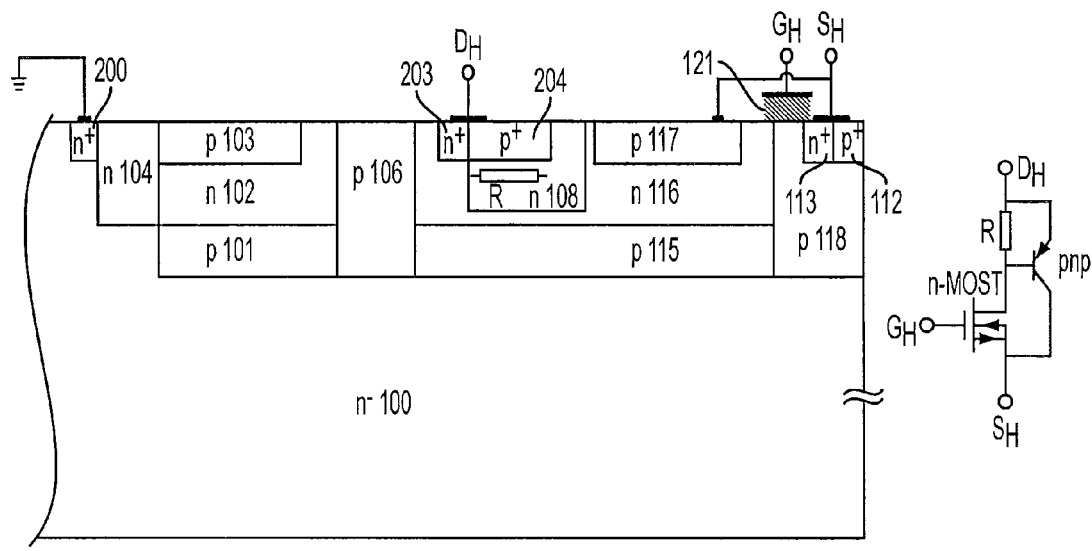
FIG. 6 shows a high-side device by using the basic structure shown in FIG. 3 and a low-side surface voltage-sustaining region (the figure shown on the right is the equivalent circuit of the high-side device).

The structure shown in FIG. 3 can also be used to implement high (low)-side device. FIG. 6 shows a high-side device with two types of carriers for conduction by using the basic structure shown in FIG. 3 and a low-side surface voltage-sustaining region. The surface voltage-sustaining region of the high-side device is constructed by n-region 116, p-region 117, the portion of p-region 115 starting from a place under the right side of 204 to the left edge of 118 and the portion of n-region 108 starting from a place under the right side of 204 to the left edge of 116; and the low-side surface voltage-sustaining region has a same structure as that of the surface voltage-sustaining region in FIG. 3. Electrode S$_H$ is connected both to n$^+$-source region 113 of n-LDMOS and source-body p-region 118 of n-LDMOS through p$^+$-region 112, and it is also connected to the terminal having the largest negative voltage. The n$^+$-region 203 is the drain region of n-LDMOS and connected to the floating voltage terminal (TUB). The electrode G$_H$ of the control terminal stands for the gate electrode of the n-LDMOS. The shaded area 121 stands for the gate oxide or gate insulator. n-region 108, p-region 117 and p$^+$-region 204 are base region, collector region and emitter region of the pnp bipolar transistor, respectively. When the voltage drop across S$_H$ and D$_H$ is very large, i.e., the high-side device is turned off and the low-side device is turned on, 204 and 117 will be punched through, then there could be a large current. In order to avoid such a punch-through, the n-region 108 needs a high dose of doping and a large length and/or narrow width to generate certain voltage drop. The figure shown on the right is the equivalent circuit of the high-side device.

The deficiency of the device in FIG. 3 is that: to make the pnp-transistor conduct, a voltage drop of 0.6~0.8V across 201 and the portion of 104 underneath 202 is paid, and this increases the entire conduction voltage drop. Besides, the current density of injected minority carriers by the bipolar transistor is not proportional to the voltage drop across the junction, so it is difficult to keep the ratio of electron current density to hole current density be a certain ideal value. The present invention also proposes a method to replace the bipolar transistor mentioned above by using a p-MOSFET with a lower conduction voltage drop.

Figure 7:
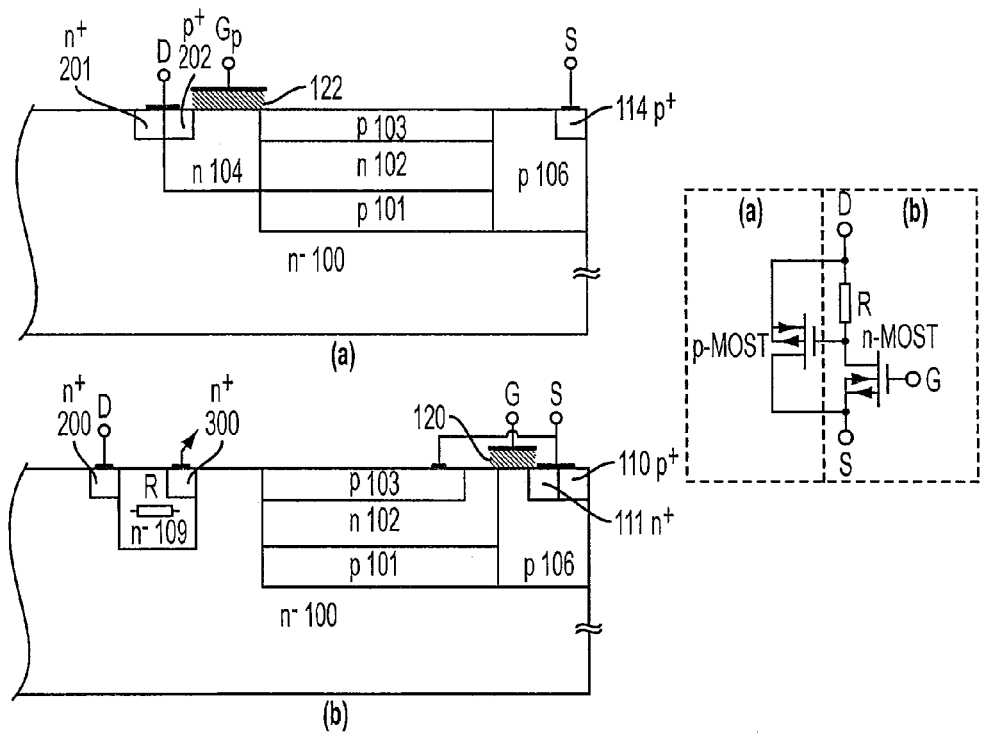
FIG. 7 shows schematically another three-terminal lateral power device with two types of carriers for conduction by using p-MOSFET to introduce hole current (the figure shown on the right is its equivalent circuit).

FIG. 7 shows another three-terminal lateral power device with two types of carriers for conduction by using p-MOSFET to introduce hole current. Such device consists of two parts shown as FIG. 7(a) and FIG. 7(b) respectively. FIG. 7(a) shows a p-MOSFET implemented by using the basic voltage-sustaining structure in Ref. [3], and FIG. 7(b) shows an n-MOSFET to supply gate voltage for the p-MOSFET shown in FIG. 7(a). These two parts are implemented in neighboring surface regions, and the equivalent circuit of them is shown in right part of FIG. 7. In this figure, D stands for the source electrode of p-MOSFET in FIG. 7(a) as well as the drain electrode of n-MOSFET in FIG. 7(b). S stands for the drain electrode of p-MOSFET in FIG. 7(a) as well as the source electrode of n-MOSFET in FIG. 7(b). G stands for the gate electrode of n-MOSFET in FIG. 7(b). It should be noted that the gate electrode G$_P$ is not an outer electrode but is directly connected by an inner connection to the n$^+$-region 300 in FIG. 7(b) or to the output terminal of a built-in circuit where 300 is connected to an input terminal of the built-in circuit. In other words, the device shown in FIG. 7 is still a three-terminal one.

When the voltage applied across G and the source-body region is larger than the threshold voltage of the n-MOSFET in FIG. 7(b), a current of electrons flow from n$^+$-region 200 into the source region of n-MOSFET through n-region 109, which acts as a resistor. When the electron current flows through such equivalent resistor, the value of the voltage of 300 is a negative one with respect to the largest voltage of electrode D. As 300 is connected to G$_P$ in FIG. 7(a), the value of the voltage of G$_P$ is a certain negative one with respect to the voltage of D. When such negative value is lower than the threshold voltage of the p-MOSFET, an inversion layer will be formed in the surface of 104, and such inversion layer produces a channel for the hole current flowing from p$^+$-region 202 to p-region 103. To obtain such negative voltage for G$_P$ in a short distance, the dose in 109 in FIG. 7(b) should be smaller than that in 104 in FIG. 7(a). When the voltage applied to G$_P$ is appropriate, the p-MOSFET in FIG. 7(a) will introduce an hole current, while the n-MOSFET in FIG. 7(b) will introduce an electron current. Thus, a lateral three-terminal power device with two types of carriers for conduction can be implemented. And a compensation of the electric fluxes by two carriers of opposite signs in a not too large area can be achieved and the surface electric flux satisfying the optimum distribution can be realized.

Figure 8:
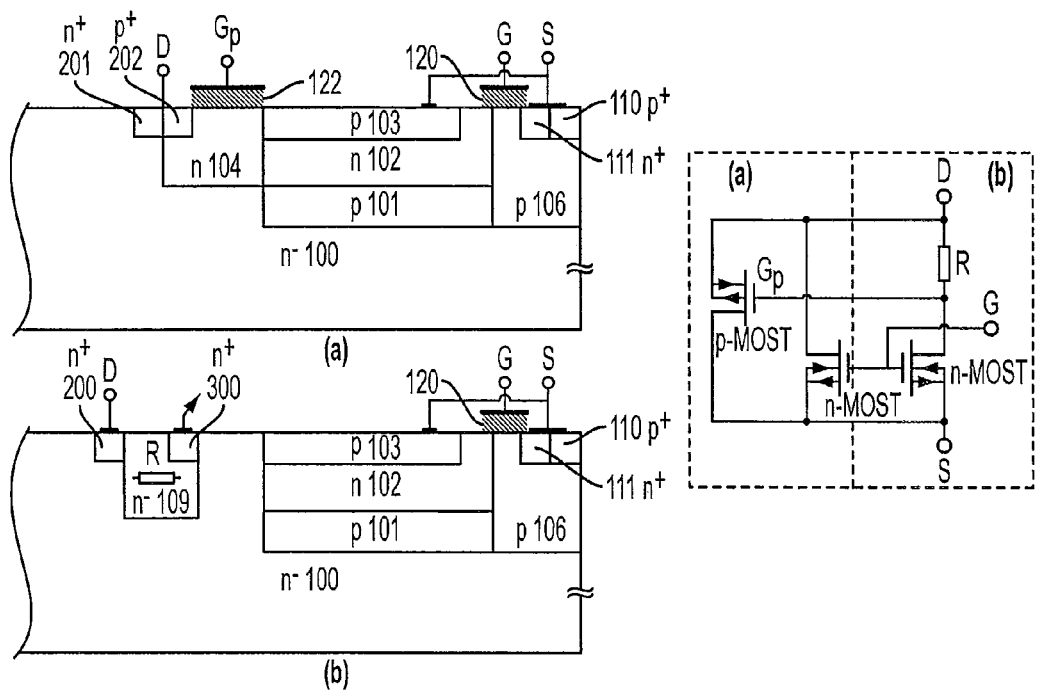
FIG. 8 shows another method for introducing a hole current by using a p-MOSFET (the figure shown on the right is its equivalent circuit).

FIG. 8 shows another method for introducing a hole current by using a p-MOSFET, where the device also consists of two parts, which are shown as FIG. 8(a) and FIG. 8(b) respectively. The part shown in FIG. 8(a) includes a p-MOSFET and an n-MOSFET, wherein the voltage-sustaining region of n-MOSFET is implemented by using the basic voltage-sustaining structure in Ref. [3]; the part shown in FIG. 8(b) is the same as that in FIG. 7(b); the two parts shown in FIG. 8(a) and FIG. 8(*b*) are implemented in neighboring surface regions and the figure on the right is the equivalent circuit. Here, D stands for the source electrode of p-MOSFET in FIG. 8(*a*) as well as the both drain electrodes of n-MOSFETs in FIG. 8(*a*) and FIG. 8(*b*); S stands for the both source electrodes of n-MOSFETs in FIG. 8(*a*) and FIG. 8(*b*); G stands for the both gate electrodes of n-MOSFETs in FIG. 8(*a*) and FIG. 8(*b*); p-region 103 is the drain region of p-MOSFET in FIG. 8(*a*). Note that the gate electrode $G_p$ of p-MOSFET in FIG. 8(*b*) is not an outer electrode, but is directly connected by an inner connection to the n$^+$-region 300 in FIG. 8(*b*) or to the output terminal of a built-in circuit when 300 is connected to an input terminal of the built-in circuit. Thus, the device shown in FIG. 8 is still a three-terminal device. Similar to the device shown in FIG. 7, when the voltage applied to G satisfies certain condition, the p-MOSFET will introduce a hole current. In comparison to the device shown in FIG. 7, the n-MOSFET in FIG. 8(*a*) can introduce a flow of electrons as well. Thus, the device shown in FIG. 8 has a smaller specific on-resistance than that of FIG. 7.

The purpose of the devices in FIG. 7 and FIG. 8 is to control the introduced holes not by any outer terminal. The method to combine such kind of device with the unipolar device shown as in FIG. 1 (three terminals are connected correspondingly) also can make a lateral three-terminal power device with two types of carriers for conduction. In fact, the methods shown in FIG. 7, FIG. 8, and even FIG. 3 are only a part of the examples of the present invention, and there are other various methods to introduce holes. Similarly, the methods to introduce electrons are also various, and the methods mentioned above are only a part of the examples of the present invention. Moreover, there are many methods to introduce both hole current and electron current in a device while maintain a compensation of hole density and electron density within a not too large area.

Figure 9:
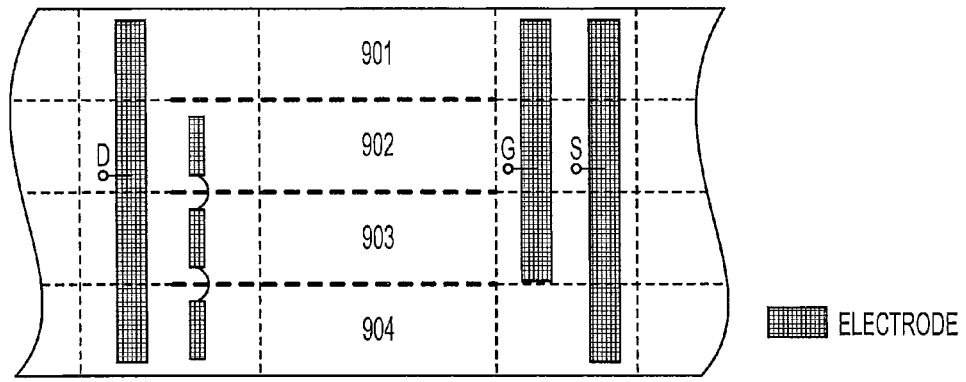
FIG. 9 shows schematically a top view of a device formed by integrating the devices shown in FIG. 1, FIG. 7 and FIG. 8.

FIG. 9 schematically shows a top view of a device formed by integrating the devices mentioned above altogether. Here, the regions 901, 902, 903, 904 stand for the devices shown in FIG. 1, FIG. 8(*a*), FIG. 7(*b*) (or FIG. 8(*b*)) and FIG. 7(*a*), respectively. The dashed line means isolation regions between two neighbouring devices. The density of electrons introduced by 901, 902 and 903 is equal to the density of holes introduced by 902 and 904 within a not too large area. Obviously, such methods can be used to implement either high-side devices and/or low-side devices, and this is not to be repeated hereinafter.

Since the resistance 109 in FIG. 7(*b*) should be very large for supplying gate voltage to p-MOSFET, the current may flow into other adjacent region with lower resistance along the direction perpendicular to the paper, it then in turn makes the gate voltage being not enough to operating the p-MOSFET properly. Therefore, when the device shown in FIG. 7(*a*) and the one shown in FIG. 7(*b*) are implemented together in neighbouring surface regions, there must be an isolation region to isolate the electron current. This is also true for the device shown in FIG. 8.

Figure 10:
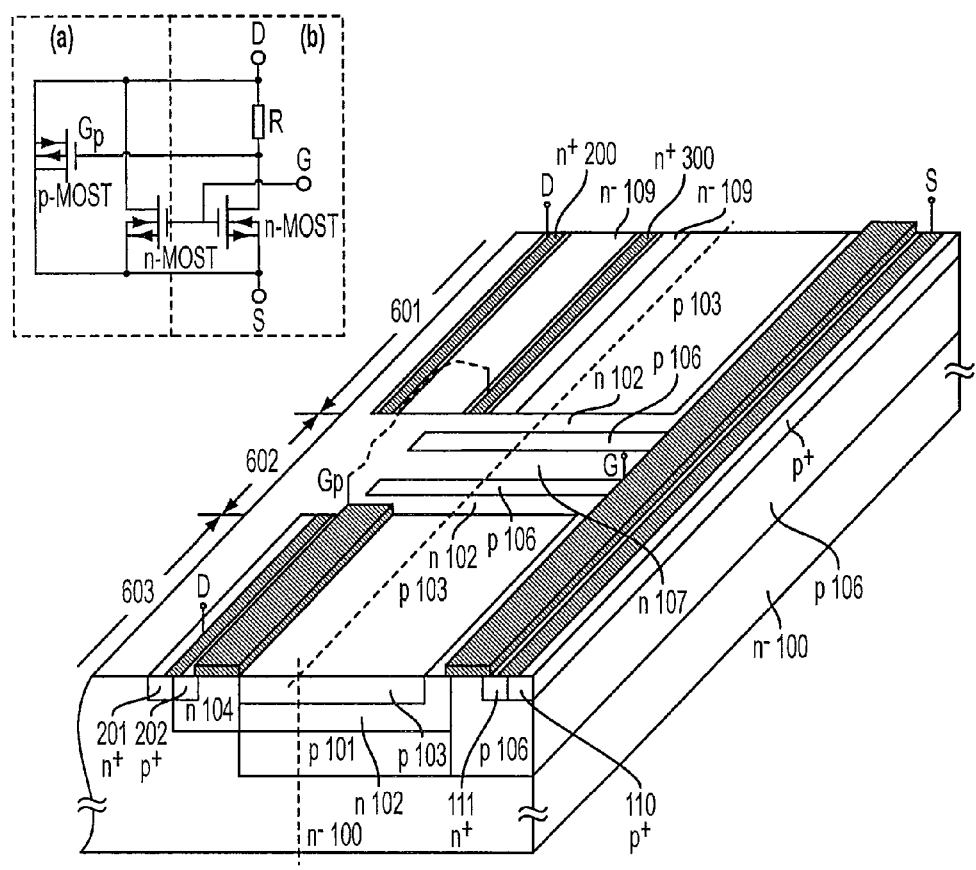
FIG. 10 shows a bird's eye view of using an isolation technique to implement the two devices shown in FIG. 8 (the figure shown in the upper left region is its equivalent circuit).

FIG. 10 shows a bird's eye view of using an isolation technique to implement the two devices shown in FIG. 8. There is an isolation region 602 between the devices of FIG. 8(*a*) marked as 603 and of FIG. 8(*b*) marked as 601. Electrode S is connected through p$^+$-region 110 to the source-body p-region 106, thereby connected with p-region 101. The n-region 107 can have a certain value of doping concentration, which is directly connected to substrate n-region 100. The upper left portion shows the equivalent circuit of this figure.

Figure 11:
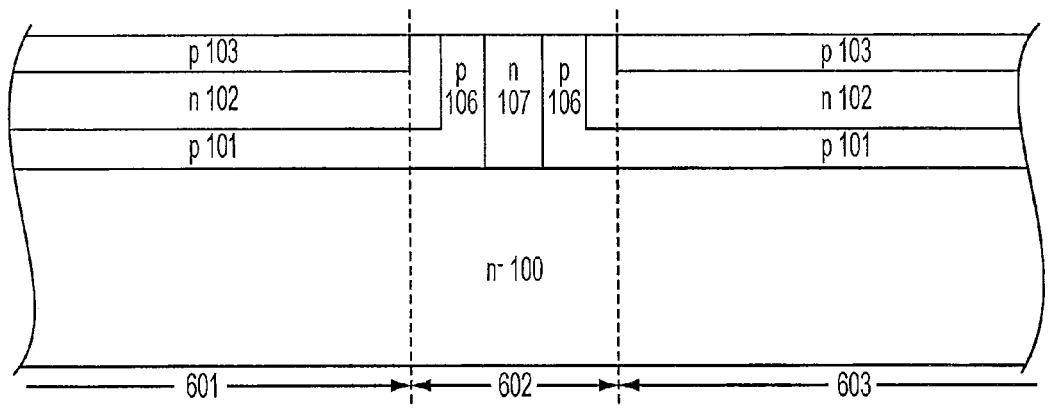
FIG. 11 shows a cross-sectional view of one method of isolation.

FIG. 11 schematically shows a cross-sectional view along the dash-line in FIG. 10. It can be seen from this figure that the isolation region 602 consists of an n-region 107 surrounded by p-region 106 and two sides of n-region 102. To obtain the effect in Ref. [2-5], when 602, 601 and 603 are fully depleted, the average value of flux density of 602 should between those of 601 and of 603.

However, the isolation technique shown in FIG. 11 brings out a restriction of the hole current and the electron current to flow in each separated device. Thus one kind of devices have excessive hole current and other kind of devices have excessive electron current. Especially, when the device of FIG. 7(*a*) is in conduction state, it has only hole current, whereas the device in FIG. 7(*b*) has only electron current. Therefore, the introduced carriers distribute not uniformly in the combined structure, and the densities of introduced electrons and holes are different in different local region. This causes the surface electric flux density not satisfying said optimum distribution in Ref. [3]. Although this problem can be solved by making the width of each device to be very small, so that the surface electric flux in a small region can still satisfy said optimum distribution, the penalty is the density of isolation regions being increased.

Figure 12:
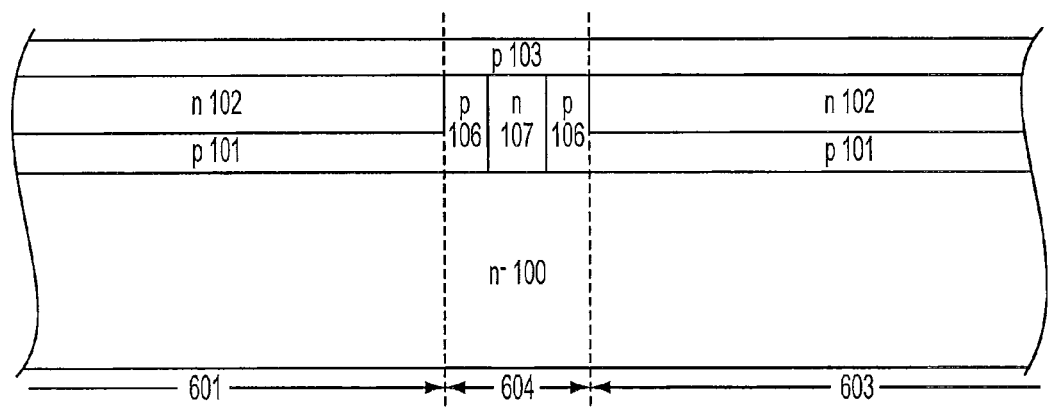
FIG. 12 shows another isolation method by connecting through the p-region at the top.

FIG. 12 shows another isolation method. In this figure, 604 stands for the isolation region between two devices. In contrast to FIG. 12, p-region 103 in different devices is connected each to other. With such a method, the device which originally has no hole current, e.g. the device shown in FIG. 7(*b*), now it has a flow of holes through p-region 103. So the total hole current would distribute evenly in the whole region of the integrated device and the surface electric flux in a small region can satisfy said optimum distribution.

Figure 13:
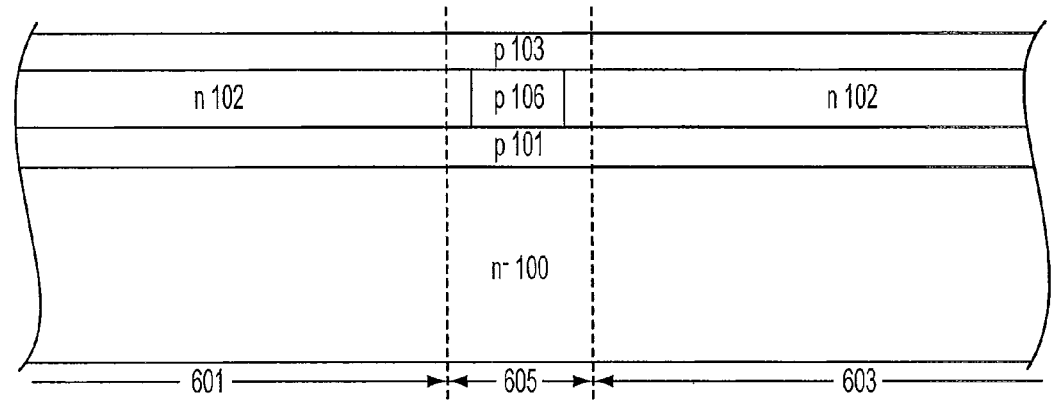
FIG. 13 shows still another isolation method by connecting through the p-regions at the top and bottom.

FIG. 13 shows another isolation method similar to FIG. 12. In this figure, p-region 101 at the bottom and p-region 103 at the top of all devices are connected throughout the whole device. This method can make devices more compact. In this figure, 605 stands for isolation region. When the p-region 106 is fully depleted, it can obstruct the electron current flowing through the depletion region and thus plays a role of isolation.

Figure 14:
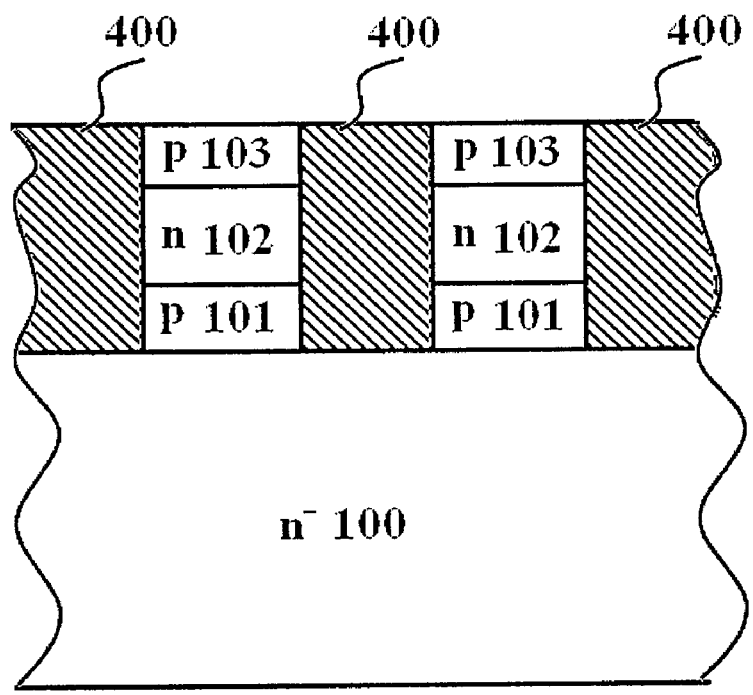
FIG. 14 shows a method by using a dielectric region for isolation.

It is obvious that for isolation region, instead of using p-n junction, dielectric isolation can also be used. FIG. 14 shows a method by using a dielectric region for isolation to the structure shown in FIG. 11. Here, 400 stands for trenches filled with dielectric. Such method can avoid the disadvantage of increasing area caused by the lateral diffusion in the p-n junction isolation. Evidently, such a method has the same problem as stated about FIG. 11, that is, the surface electric flux in local region can not satisfy said optimum distribution.

Figure 15:
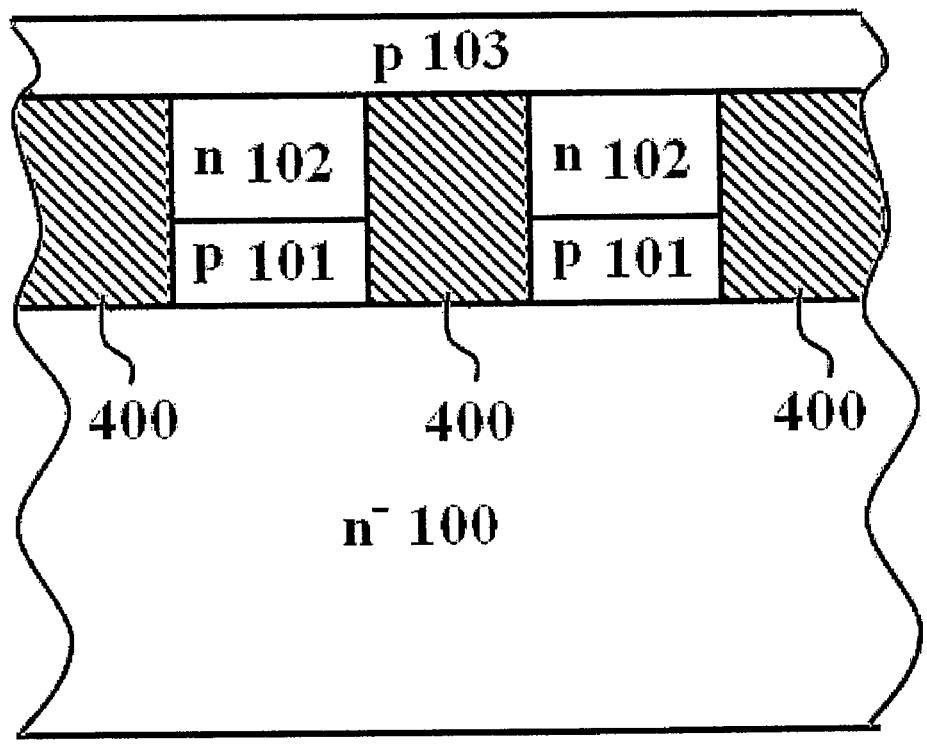
FIG. 15 shows a structure by using dielectric isolation to replace the p-n junction isolation in FIG. 12.
Figure 16:
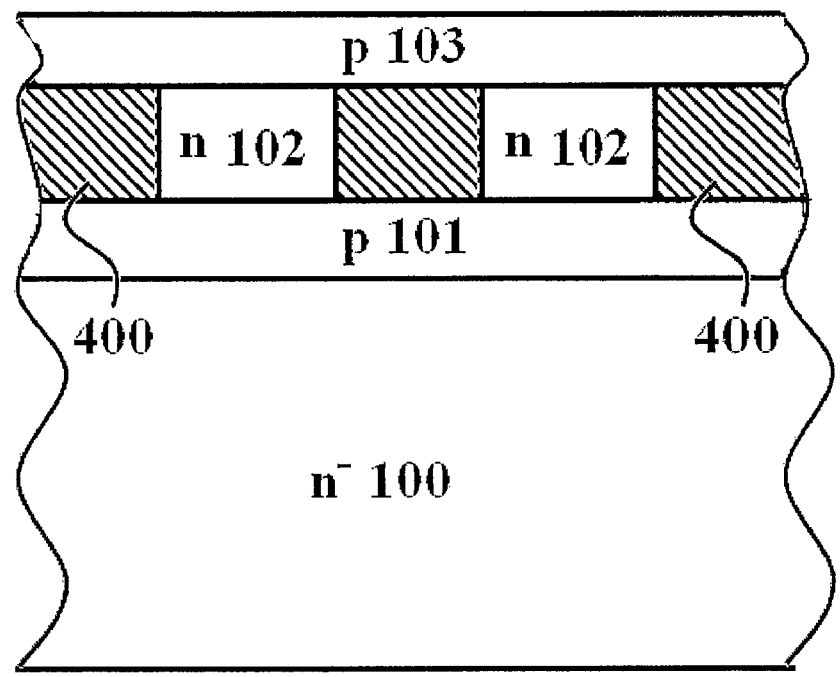
FIG. 16 shows a structure by using dielectric isolation to replace the p-n junction isolation in FIG. 13.

FIG. 15 and FIG. 16 show the structures by using dielectric isolation to replace the p-n junction isolation in FIG. 12 and FIG. 13, respectively. To compare with the structure shown in FIG. 14, the effective surface electric flux can satisfy the optimum distribution in a not too large area by modification of p-type region 103. In addition, the technique of using dielectric can eliminate the leakage current between two neighboring device.

Figure 17:
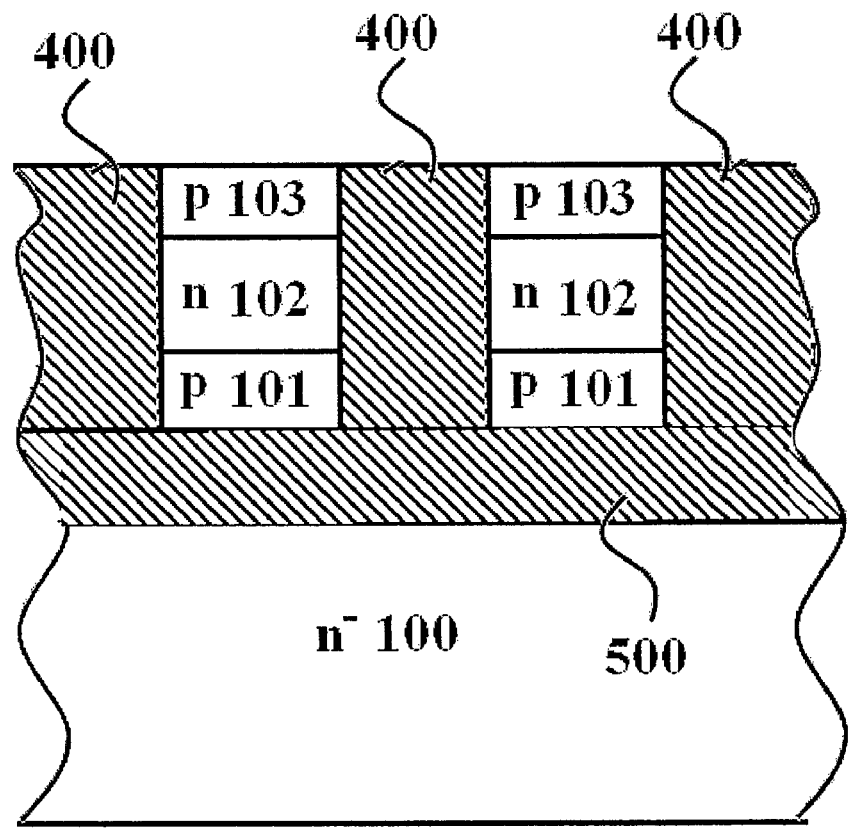
FIG. 17 shows a method by using the technique of SIS for isolation.

Naturally, the technique of SIS (silicon-insulator-silicon) can also be used for isolation, such as shown in FIG. 17. Here, 500 stands for the insulator layer. As the insulator layer has a higher critical electric field than that of silicon, a local strong electric field does not cause significant impact ionization, so the device has a better performance.

Despite all of the examples illustrated above are about that the control terminal directly controls the electron current and a hole current is simultaneously introduced due to the electron current, it is obvious that there are other kinds of devices with a control terminal to control the hole current and thereby an electron current is introduced.

Figure 18:
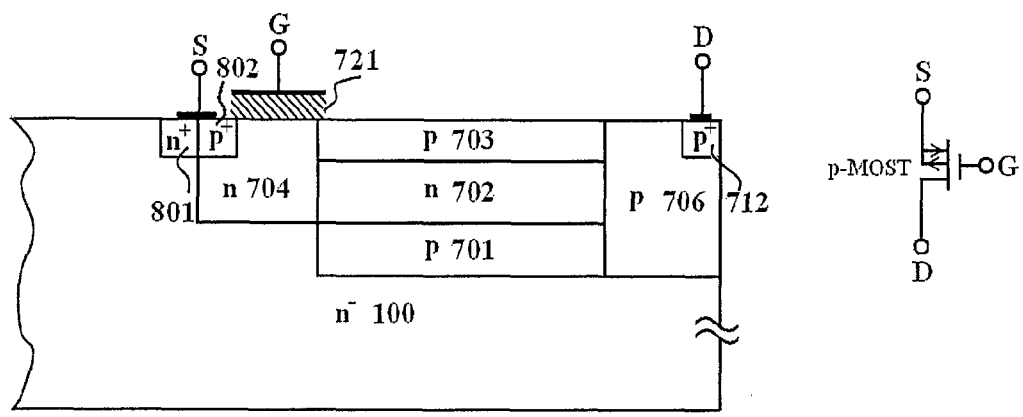
FIG. 18 shows a p-MOSFET only with holes for conduction (the figure shown on the right is its equivalent circuit).

FIG. 18 shows a p-MOSFET only having holes for conduction. The voltage-sustaining region of the device consists of p-region 701, n-region 702, p-region 703 and a portion of n-region 704 as well as a portion of p-region 706. Here S stands for the source electrode of p-region, connected both to $p^+$-region 802 and source-body n-region 704 through $n^+$-region 801; $p^+$-region 712 is the drain region of the p-MOSFET; G stands for the gate electrode, and the shaded area 721 stands for the gate oxide or gate insulator. The right portion of this figure shows the equivalent circuit of the device.

Figure 19:
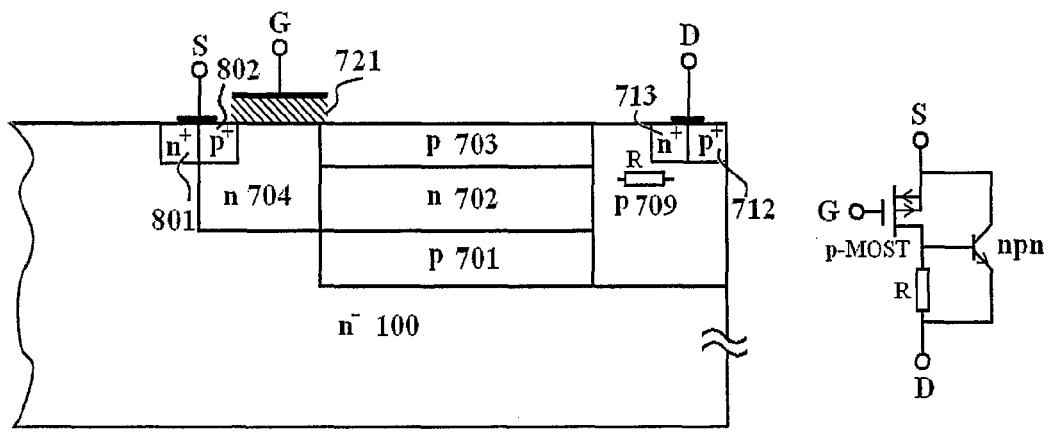
FIG. 19 shows a three terminal device by using an npn transistor to introduce a flow of electrons initiated by a flow of holes produced by the p-MOSFET in FIG. 18 (the figure shown on the right is its equivalent circuit).

FIG. 19 shows a three terminal device by using an npn transistor to introduce a flow of electrons initiated by a flow of holes produced by a p-MOSFET. The principle of the device is similar with the one shown in FIG. 3. Here, $n^+$-region 713, p-region 709 and n-region 702 are emitter region, base region and collector region of the npn transistor, respectively. The portion of p-region 709 with hole current flowing can be equivalent to a series resistor R shown in the figure. When there is a hole current flowing through the equivalent resistor, a voltage drop is developed across it, which makes the npn transistor conduct, and an electron current is formed. The figure on the right shows the equivalent circuit.

Figure 20:
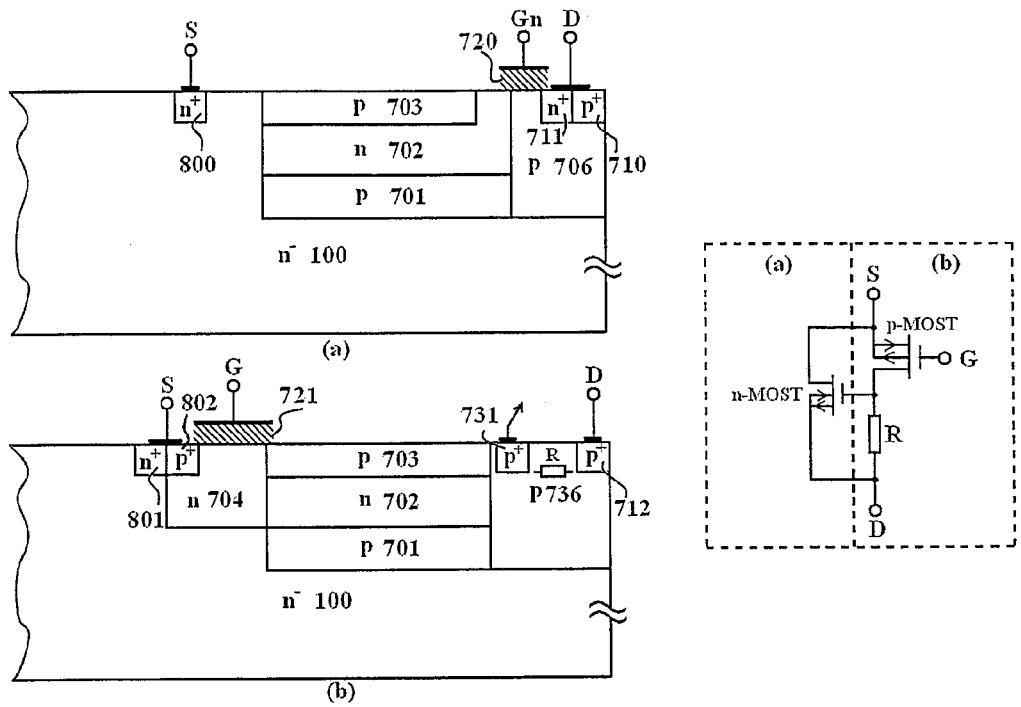
FIG. 20 shows another three-terminal lateral power device with two types of carriers for conduction by using an n-MOSFET to introduce electron current (the figure shown on the right is its equivalent circuit).

FIG. 20 shows another three-terminal lateral power device with two types of carriers for conduction by using an n-MOSFET to introduce electron current. Such device consists of two parts, which are shown as FIG. 20(a) and FIG. 20(b), respectively. FIG. 20(a) shows an n-MOSFET implemented by using the basic voltage-sustaining structure in FIG. 18, and FIG. 20(b) shows a p-MOSFET to supply gate voltage for the n-MOSFET shown in FIG. 20(a). When the voltage applied to G respected to the source-body region of the p-MOSFET is a certain negative value, there is a hole current flowing from $p^+$-region 731 into the drain region 712 of p-MOSFET through p-region 736, which serves as a resistor. When the hole current flows through such a resistor, the voltage across the resistor is a positive one with respect to the electrode D, which has the lowest potential. The electrode $G_n$ shown in FIG. 20(a) is connected to $p^+$-region 731. And when the voltage value of $G_n$ with respect to p-region 706 reaches a certain positive one, then an inversion layer is formed in the surface of 706, making n-MOSFET conduct. Note that the structure shown in FIG. 20 is again a three-terminal device by using the gate electrode of p-MOSFET as the control terminal and the gate electrode of n-MOSFET has an inner connection. The figure on the right portion shows an equivalent circuit of combination of the two parts.

Figure 21:
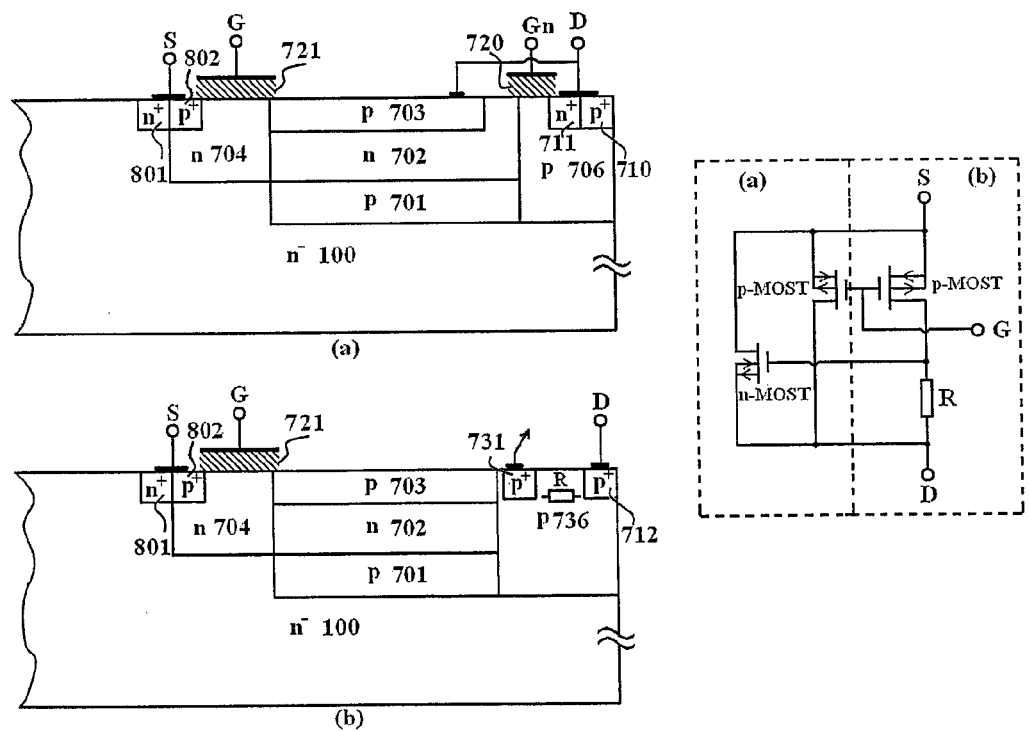
FIG. 21 shows still another method to implement a lateral three-terminal device with two types of carriers for conduction by using n-MOSFET to introduce a flow of electrons (the figure shown on the right is its equivalent circuit).

FIG. 21 shows another method to implement a lateral three-terminal device with two types of carriers for conduction by using n-MOSFET to introduce a flow of electrons. Here, the structure shown in FIG. 21(b) is the same with that in FIG. 20(b). As distinct from the device in FIG. 20(a), the device in FIG. 21(a) can introduce a flow of electrons as well. Thus, compared to the device in FIG. 20, the device in FIG. 21 can have a smaller specific on-resistance. The figure on the right shows an equivalent circuit.

Similar to FIG. 7 and FIG. 8, isolation regions must be set between the devices shown in FIG. 20(a) and FIG. 20(b) and between the devices shown in FIG. 21(a) and FIG. 21(b). Such isolation regions are used to obstruct the hole currents in the direction perpendicular to the paper. Apparently, the isolation method shown in FIG. 11 can be used for this propose, with the same problem that the surface electric flux distribution deviates from the optimum one due to the existence of local excessive holes.

Figure 22:
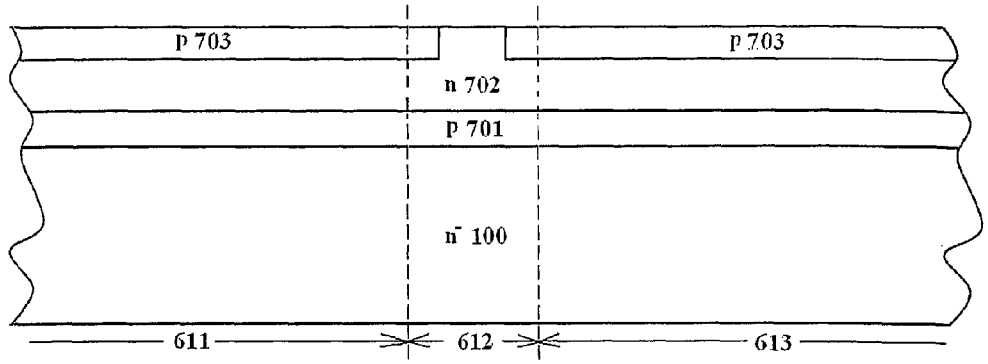
FIG. 22 shows a method of isolation with connection of n-region in the middle layer throughout all of the devices.
Figure 23:
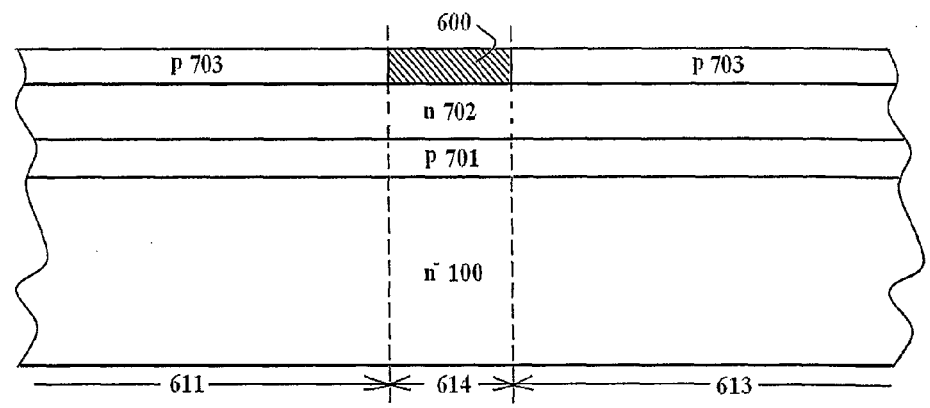
FIG. 23 shows a method of isolation by using dielectric to replace the p-region in FIG. 22.

FIG. 22 shows a method of isolation with connection of n-region 702 throughout all of the devices. By such method, the devices, e.g. shown in FIG. 20(b) or FIG. 21(b), which originally would have no electron for conduction, now turn out to have a flow of electrons introduced by other devices, so the surface electric flux distribution in every local region of the combination device can satisfy said optimum distribution. In this figure, 611 stands for the voltage-sustaining region of a device, 613 stands for the voltage-sustaining region of another device, and 612 stands for the isolation region between them. In the isolation method shown in FIG. 12, 107 is set between the two p-region 106. Similarly, a p-region can be set in the middle of 702 to connect to p-region 701. Here, such a p-region does not need to contact with p-region 703, and even does not extend from 701 to the top. Certainly, the part of 702 between the two p-region can be replaced by a trench of dielectric, as shown in FIG. 23, wherein 600 stands for the dielectric isolation region.

Figure 24:
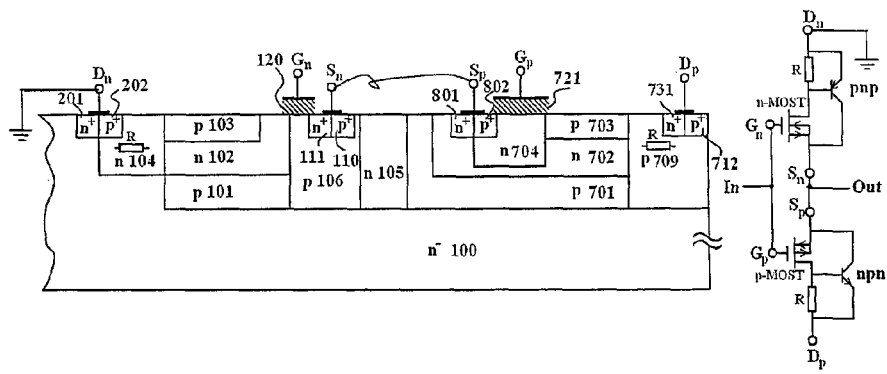
FIG. 24 shows a CMOS implemented by integrating the devices shown in FIG. 3 and FIG. 19.

A high-voltage CMOS can be realized by integrating the device of this invention utilizing the gate electrode of the p-MOSFET in it as the outer control terminal and the device of this invention utilizing the gate electrode of the n-MOSFET in it as the outer control terminal. This is shown in FIG. 24. Here, the largest negative voltage is applied to the electrode $D_p$ and the smallest one is applied to the electrode $D_{p'}$; the gate electrodes $G_n$ and $G_p$ are connected together as the input terminal of the CMOS and the electrodes $S_p$ and $S_n$ are connected together as the output terminal of the CMOS. The figure on the right shows the equivalent circuit of the CMOS.

Although the impurity profile in the above mentioned voltage-sustaining region is set as Ref. [4], it is evident that the methods of the present invention can be used in such cases as: the multilayer surface voltage-sustaining region by using the technique of RESURF or by using the technique of JTE with impurity profile made by two-sections with different values and other multilayer surface voltage-sustaining regions with other kinds of impurity profile.

Some examples of the present invention have been illustrated above. It should be understood that various other examples of application, which should be included in the scope of the present invention as defined in the claims, will be apparent to those skilled in the art.

Although the invention has been described and illustrated with reference to specific embodiments thereof, it is not intended that the invention be limited to these illustrative embodiments. Those skilled in the art will recognize that modifications and variations can be made without departing from the spirit of the invention. The object of choosing and describing the examples of the application of the present invention is for better explanation of the theory and practical applications. Apparently, the examples chosen above are for those skilled in the art to understand the present invention and thus be able to design various applications with various modifications for special utilizations.

The invention claimed is:

1. A semiconductor lateral device having three outer terminals formed on a substrate of first conductivity type with current in conduction state comprising of flows of two types of majorities simultaneously in their own drift region, said device consists of a highest voltage region and a lowest voltage region with said substrate being zero voltage and a surface voltage-sustaining region between said highest voltage region and said lowest voltage region;

wherein said surface voltage-sustaining region has at least three layers, a positive integral number of order of said layers is set starting from a layer contacted to said substrate up to the top of semiconductor surface, layers of odd numbers are semiconductor of second conductivity type and serve as drift regions of majorities of second conductivity; layers of even number numbers are semiconductor regions of a first conductivity type and serve as drift regions of majorities of first conductivity type;

said highest voltage region is a semiconductor region of second conductivity type and contacted directly to said first layer of said surface voltage-sustaining region, an electrode of highest voltage is formed on the top of said highest voltage region and serves as an outer terminal of highest voltage; said highest voltage region can have a first active device region of majorities of first conductivity type, where a semiconductor region of first conductivity type serving as source region of majorities of first conductivity type is formed inside said highest voltage region, and a part of said source region of first active device region is contacted directly to said electrode of highest voltage; said first active device region of majorities of first conductivity type has a first control terminal for controlling majorities of first conductivity type flow to said layers of even number of said surface voltage-sustaining region;

said lowest voltage region is a semiconductor region of first conductivity type, an electrode of lowest voltage is formed on the top of said lowest voltage region and serves as an outer terminal of lowest voltage; said lowest voltage region can have a second active device region of second conductivity type, where a semiconductor region of second conductivity type serving as source region of majorities of second conductivity type is formed inside said lowest voltage region, and a part of said second active device region is contacted directly to said electrode of lowest voltage; said second active device region of second conductivity type has a second control terminal for controlling majorities of second conductivity type flow to said layers of odd number of said surface voltage-sustaining region;

said surface voltage-sustaining region has at least an inner terminal;

when said inner terminal is located inside a layer of semiconductor of first conductivity type close to second active device region, said inner terminal connected directly or indirectly to second control terminal, then, second control terminal, is not an outer terminal;

when said inner terminal is located inside a layer of semiconductor of second conductivity type close to first active device region, said inner terminal connected directly or indirectly to first control terminal, then, first control terminal, is not an outer terminal;

said semiconductor lateral device is formed by integrating different kinds of sub-devices, each sub-device has its own highest voltage region and lowest voltage region and surface voltage-sustaining region; each kind of sub-device includes an inner terminal and/or or an outer terminal;

the highest reverse bias voltage is sustained between said highest voltage region and the bottom of the substrate, said highest voltage region has an average density of doping of second conductivity type not smaller than $D_0$, said average density of doping of second conductivity type means the total numbers of doped impurities of second conductivity type in an area minus the total numbers of doped impurities of first conductivity type in the same area divided by the area; said area refers to such an area that the dimension of it in any direction along the semiconductor surface being much smaller than the depletion depth of said substrate of a one-sided abrupt parallel-plane junction made by the same substrate under its maximum reverse applied voltage, $D_0$ means the density of depleted ionized impurities of second conductivity type of said one-sided abrupt parallel-plane junction made by the same substrate under its maximum reverse applied voltage;

when said semiconductor region of first conductivity type is p-type and said majorities of first conductivity type are holes and said semiconductor region of second conductivity type is n-type and said majorities of second conductivity type are electrons, said highest reverse voltage to said substrate of zero voltage is a positive value;

when said semiconductor region of first conductivity type is n-type and said majorities of first conductivity type are electrons and said semiconductor region of second conductivity type is p-type and said majorities of second conductivity type are holes, said highest reverse voltage to said substrate of zero voltage is a negative value.

2. A semiconductor lateral device according to claim 1, wherein an average density of doping of second conductivity type of first layer of said surface voltage-sustaining region varies from a value not larger than $2D_0$ to a value close to $D_0$ with the distance from said highest voltage region to said lowest voltage region;

an average density of doping of last layer is not larger than $D_0$;

an average density of doping of a layer neither the first one nor the last one has a value not larger than $2D_0$ at a place closest to said highest voltage region and a value not larger than $1.8D_0$ at a place closest to said lowest voltage region;

an average density of doping of second conductivity type of said surface voltage-sustaining region varies from a value of $D_0$ to a value close to zero with the distance from said highest voltage region to said lowest voltage region.

3. A surface voltage-sustaining region according to claim 1, wherein except first layer, a portion contacted directly to highest voltage region and a portion contacted directly to lowest voltage region are semiconductor regions of first conductivity type.

4. A semiconductor lateral device according to claim 1, wherein said sub-devices have four kinds:

the sub-device of the first kind has an inner terminal in its surface voltage-sustaining region and has a control terminal in highest voltage region or in lowest voltage region, wherein said control terminal is not an outer terminal;

the sub-device of the second kind does not have an inner terminal in its surface voltage-sustaining region and has a control terminal in highest voltage region or in lowest voltage region, wherein said control terminal is not an outer terminal;

the sub-device of the third kind has an inner terminal in its surface voltage-sustaining region and does not have a control terminal in highest voltage region or in lowest voltage region;

the sub-device of the fourth kind does not have an inner terminal in its surface voltage-sustaining region and does not have a control terminal in highest voltage region or in lowest voltage region;

said semiconductor lateral device is formed by integrating at least sub-devices of the first kind, or by integrating at least sub-devices of the second kind and sub-devices of the third kind.

5. A semiconductor lateral device according to claim 4 is formed by integrating of at least of two kinds of sub-devices, wherein an isolation region is formed between two surface voltage-sustaining regions of two kinds of sub-devices.

6. A semiconductor lateral device according to claim 1, wherein an inner circuit is formed in said semiconductor lateral device, said inner terminal is connected through an inner-connection to an input terminal of said inner circuit, an output terminal of said inner circuit is connected to a control terminal, said control terminal is not an outer terminal.

7. A semiconductor lateral device according to claim 1, wherein an insulator layer(s) is (are) formed between two neighboring layers of opposite conductivity type of the surface voltage-sustaining region, each said insulator layer has a thickness smaller than the total thickness of the surface voltage-sustaining region.

8. A semiconductor lateral device according to claim 1, wherein an insulator layer is formed between said semiconductor lateral device and said substrate, an electrode is formed at the bottom of said substrate and connected through an outer wire to said electrode of lowest voltage.

9. A semiconductor lateral device according to claim 5, wherein said isolation region between two neighboring surface voltage-sustaining regions of two sub-devices has a width much smaller than the depletion depth of said substrate of a one-sided abrupt parallel-plane junction made by the same substrate under its maximum reverse applied voltage; said isolation has an average density of doping of second conductivity type of a value between both average densities of doping of second conductivity type of two neighboring surface voltage-sustaining regions.

10. A semiconductor lateral device according to claim 4, wherein
when said inner terminal in a surface voltage-sustaining region is located in a semiconductor layer of first conductivity type and close to said lowest voltage region,
said sub-device of the first kind has an emitter region and a base region of a bipolar transistor in its lowest voltage region, and has a source region and a gate region of a MOSFET in its highest voltage region;
said sub-device of the second kind has a source region and a gate region of a MOSFET in its lowest voltage region, said gate is a control terminal but not an outer terminal;
said sub-device of the third kind has a source region and a gate region of a MOSFET in its highest voltage region and has an inner terminal in lowest voltage portion of a semiconductor layer of first conductivity type of its surface voltage-sustaining region;
said sub-device of the forth kind has a source region and a gate region of a MOSFET in its highest voltage region;
when said inner terminal in a surface voltage-sustaining region is located in a semiconductor layer of second conductivity type and close to said highest voltage region;
said sub-device of the first kind has an emitter region and a base region of a bipolar, transistor in its highest voltage region, and has a source region and a gate region of a MOSFET in its lowest voltage region;
said sub-device of the second kind has a source region and a gate region of a MOSFET in its highest voltage region, said gate is a control terminal but not an outer terminal;
said sub-device of the third kind has a source region and a gate region of a MOSFET in its lowest voltage region and has an inner terminal in highest voltage portion of a semiconductor layer of second conductivity type of its surface voltage-sustaining region;
said sub-device of the forth kind has a source region and a gate region of a MOSFET in its lowest voltage region;
said base of the bipolar transistor of said sub-device of the first kind is also an inner control terminal; said not an outer terminal of said sub-device of the second kind is connected directly or indirectly to said inner terminal of said sub-device of the third kind.

11. A semiconductor lateral device according to claim 10, wherein
when said inner terminal in a surface voltage-sustaining region is located inside a semiconductor layer of first conductivity type and close to said lowest voltage region, said inner terminal is connected to a semiconductor layer of first conductivity type of said surface voltage-sustaining region to an electrode of lowest voltage through an layers of odd numbers semiconductor of second conductivity type;
when said inner terminal in a surface voltage-sustaining region is located inside a semiconductor layer of second conductivity type and close to said highest voltage region, said inner terminal is connected to a semiconductor layer of second conductivity type of said surface voltage-sustaining region to an electrode of highest voltage through an layers of even numbers semiconductor of first conductivity type.

12. A semiconductor lateral device according to claim 5, wherein
when said inner terminal in a surface voltage-sustaining region is located inside a semiconductor layer of the first conductivity type and close to said lowest voltage region, an isolation region between two neighboring sub-devices of different kinds is formed such that said isolation region has at least a semiconductor region of the second conductivity type contacted directly to the first layers of surface voltage-sustaining regions of two neighboring sub-devices and extended to the surface of semiconductor;
when said inner terminal in a surface voltage-sustaining region is located inside a semiconductor layer of the second conductivity type and close to said highest voltage region, an isolation region between two neighboring sub-devices of different kinds is formed such that said isolation region has at least a semiconductor region of the first conductivity type contacted directly to the layers of even numbers of surface voltage-sustaining regions of two neighboring sub-devices and extended to the surface of semiconductor.

13. A semiconductor lateral device according to claim 4, wherein
when said inner terminal in a surface voltage-sustaining region is located inside a semiconductor layer of the first conductivity type and close to said lowest voltage region, said isolation region between two neighboring sub-devices of different kinds has a middle portion of semiconductor layer of the first conductivity type contacted directly to the substrate;
when said inner terminal in a surface voltage-sustaining region is located inside a semiconductor layer of the second conductivity type and close to said highest voltage region, said isolation region between two neighboring sub-devices of different kinds has a middle portion of semiconductor layer of the second conductivity type contacted directly to both first layers of surface voltage-sustaining regions of two neighboring sub-devices.

14. A semiconductor lateral device according to claim 12, wherein when said inner terminal in a surface voltage-sustaining region is located inside a semiconductor layer of the first conductivity type and close to said lowest voltage region, said isolation region has a portion of semiconductor layer of the second conductivity type contacted directly to both layers of odd numbers except the first layer of surface voltage-sustaining regions of two neighboring sub-devices;

when said inner terminal in a surface voltage-sustaining region is located inside a semiconductor layer of the second conductivity type and close to said highest voltage region, said isolation region has a portion of semiconductor layer of the first conductivity type contacted directly to both layers of even numbers of surface voltage-sustaining regions of two neighboring sub-devices;

said isolation region can also has a middle portion formed by an insulator.

15. A high-side high-voltage device and a low-side high-voltage device formed by semiconductor lateral device according to claim 1, wherein said high-side high-voltage device has a highest voltage region and a lowest voltage region, said lowest voltage region can sustain a voltage from zero up to the highest voltage and is a floating voltage region, said high-side high-voltage device has a surface voltage-sustaining region called first surface voltage-sustaining region; the first layer of first surface voltage-sustaining region has an average density of doping of second conductivity type not smaller than $D_0$, said low-side high-voltage device has a highest voltage region being said floating voltage region and a lowest voltage region being a zero voltage region, said low-side high-voltage device has a surface voltage-sustaining region called second surface voltage-sustaining region;

an isolation region is formed between the floating voltage region of said high-side high-voltage device and the floating voltage region of said low-side high-voltage device;

when a voltage across said highest voltage region and said lowest voltage region of anyone of said high-voltage device approaches zero, said layers of surface voltage-sustaining region of this device keep not depleted, except the first layer.

16. A high-side high-voltage device and a low-side high-voltage device formed by semiconductor lateral device according to claim 15 is connected as a totem pole, wherein said high-side high-voltage device comprising at least a first active device region of carriers of first conductivity type and an outer terminal as a first control terminal in its highest voltage region; said low-side high-voltage device comprising at least a second active device region of carriers of first conductivity type and an outer terminal as a second control terminal in its floating voltage region;

or, said high-side high-voltage device comprising at least a second active device region of carriers of second conductivity type and an outer terminal as a first control terminal in its floating voltage region; said low-side high-voltage device comprising at least an active device region of carriers of second conductivity type and an outer terminal as a second control terminal in its lowest voltage region.

17. A high-side high-voltage device and a low-side high-voltage device formed by semiconductor lateral device according to claim 15 is connected as a CMOS, wherein said high-side high-voltage device comprising at least an active region of a second MOSFET of second conductivity type with an outer terminal as a second control terminal;

said low-side high-voltage device comprising at least an active region of a first MOSFET of first conductivity type with an outer terminal as a first control terminal.

18. A. high-voltage device according to claim 15, wherein an insulator layer is formed between said semiconductor lateral devices and said substrate, an electrode is formed at the bottom of said substrate and connected through an outer wire to said electrode of lowest voltage.

\* \* \* \* \*